United States Patent [19]
Nakao et al.

[11] Patent Number: 5,926,377
[45] Date of Patent: Jul. 20, 1999

[54] MULTILAYER PRINTED BOARD

[75] Inventors: Tomoyuki Nakao; Shinya Yamaguchi; Makoto Mukai; Shinichi Ohtsu, all of Kawasaki, Japan

[73] Assignee: Fujitsu Limited, Kawasaki, Japan

[21] Appl. No.: 08/971,901

[22] Filed: Nov. 17, 1997

[30] Foreign Application Priority Data

Mar. 31, 1997 [JP] Japan .................................. 9-079522

[51] Int. Cl.⁶ ............................ H05K 1/16; H05K 1/03
[52] U.S. Cl. ...................... 361/763; 361/780; 361/794; 361/795; 174/255; 174/258; 174/260; 174/262; 333/12; 333/246
[58] Field of Search ................................. 361/734, 749, 361/750, 751, 763, 780, 792, 794, 795, 816, 818, 766; 174/250, 251, 254–258, 260–262, 264, 266; 333/12, 246; 257/723–725, 700, 728; 29/832

[56] References Cited

U.S. PATENT DOCUMENTS

| | | | |
|---|---|---|---|
| 5,081,561 | 1/1992 | Smith | 174/250 |
| 5,376,759 | 12/1994 | Marx et al. | 174/255 |
| 5,523,921 | 6/1996 | Van Lydegraf | 361/818 |
| 5,708,400 | 1/1998 | Morris | 333/12 |
| 5,781,110 | 7/1998 | Habeger, Jr. et al. | 29/832 |
| 5,793,098 | 8/1998 | Uchida | 257/665 |

FOREIGN PATENT DOCUMENTS 53-068870  6/1978  Japan .
1-164057  6/1989  Japan .

Primary Examiner—Leo P. Picard
Assistant Examiner—John B. Vigushin
Attorney, Agent, or Firm—Staas & Halsey

[57] ABSTRACT

A multilayer printed board has at least a signal layer, a power source layer, and a ground layer that are formed one upon another with insulation material being interposed among the layers. The board is capable of reducing radio waves to be emitted from the board.

The board is provided with capacitors that are continuously or discretely formed at the edges of an overlapping pattern of the power source layer and ground layer, to pass a high-frequency current from the power source layer to the ground layer, thereby reducing the emission of radio waves.

16 Claims, 18 Drawing Sheets

Fig.11
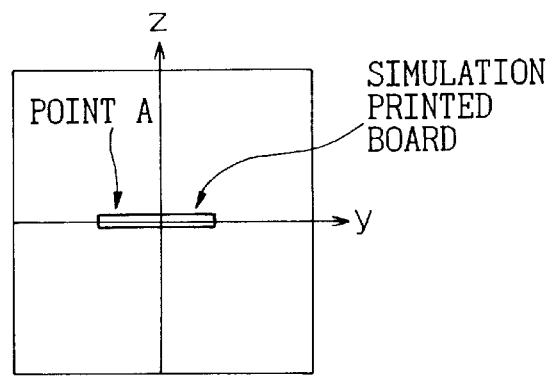
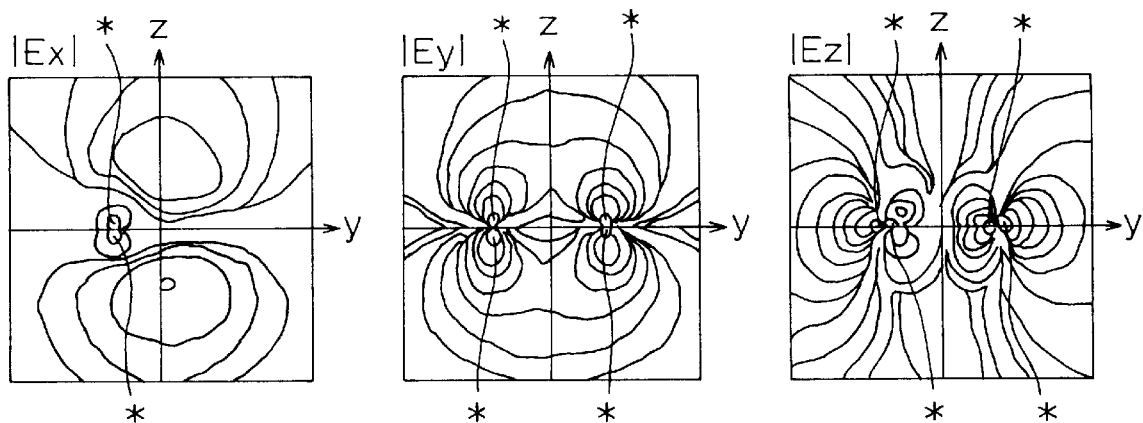

Fig.13
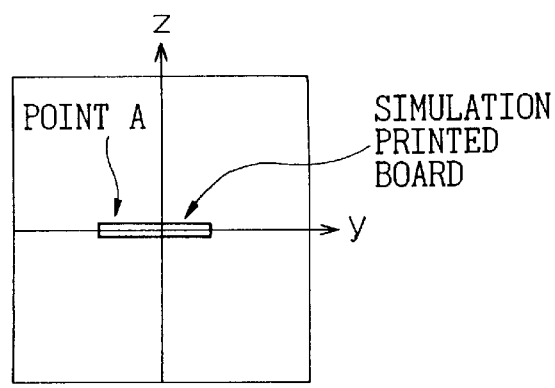
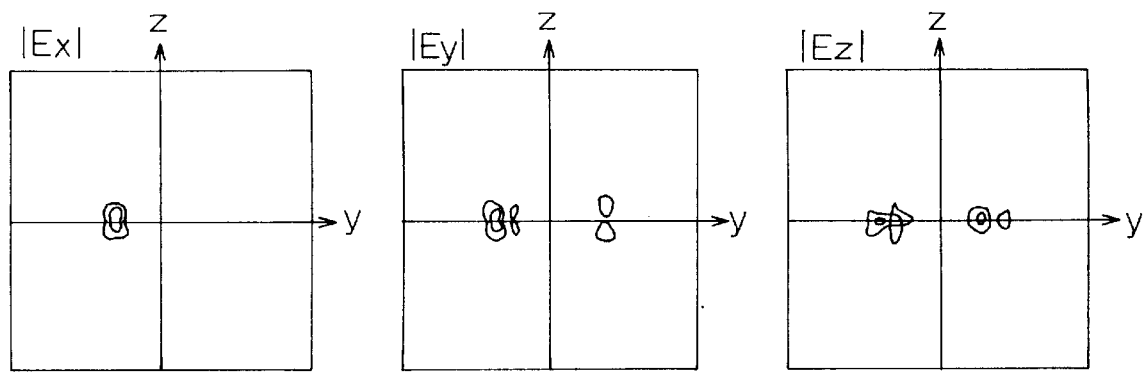

ARRANGING ZONE

ARRANGING ZONE

Fig.18
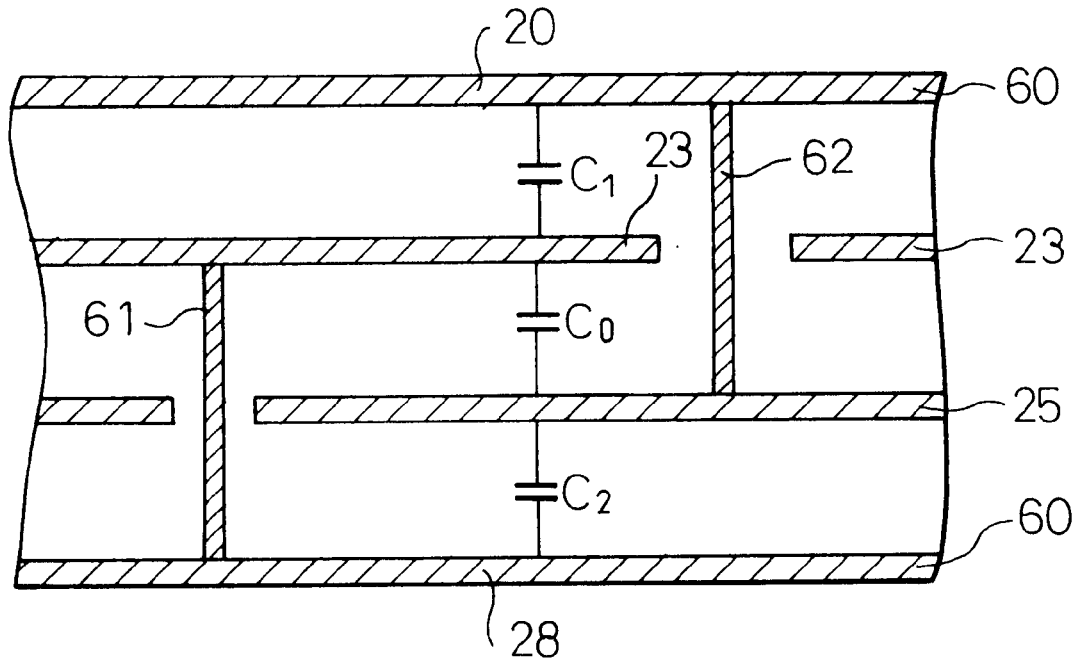
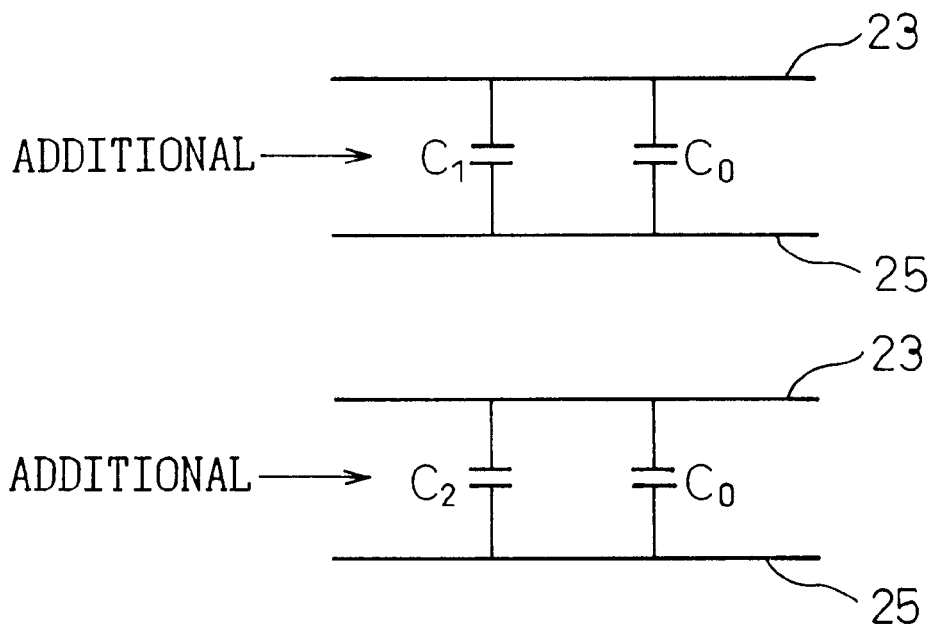

MULTILAYER PRINTED BOARD

BACKGROUND OF THE INVENTION

1. Field of the Invention

The present invention relates to a multilayer printed board consisting of a signal layer, a power source layer, and a ground layer that are formed one upon another with insulation material being interposed between them. In particular, the present invention relates to a multilayer printed board capable of reducing radio waves emitted from the board.

Many countries have strict regulations to restrict electronic equipment from emitting unwanted radio waves and noise exceeding specific levels.

Electronic equipment needs a technique of minimizing the emission of such radio waves.

2. Description of the Related Art

To reduce radio waves emitted from an electronic apparatus, prior arts provide the apparatus with a structure for entirely shielding the apparatus.

The shielding structure may reduce radio waves to be emitted from the apparatus.

No prior arts have proposed an idea to reduce radio waves emitted from a printed board installed in an electronic apparatus. Instead, the prior arts have considered the electronic apparatus itself and have reduced radio waves emitted from the apparatus as a whole by entirely shielding it.

Some electronic apparatuses are not well shielded. For these, the radio waves must be reduced at the level of printed boards installed of in them instead at an overall level of each apparatus.

Although it has generally been understood that radio waves might be emitted from the edges of a printed board, no verification about it has been made yet. Therefore, no proposal has been made so far for a structure of reducing radio waves emitted from a printed board.

SUMMARY OF THE INVENTION

An object of the present invention is to provide a multilayer printed board capable of reducing radio waves to be emitted therefrom.

In order to accomplish the object, there is provided, according to an aspect of the present invention, a multilayer printed board having at least a signal layer, a power source layer, and a ground layer that are formed one upon another with insulation material being interposed among them. The multilayer printed board comprises capacitors continuously or discretely formed at the edges of an overlapping pattern of the power source layer and ground layer, to pass a high-frequency current from the power source layer to the ground layer.

According to a second aspect of the present invention, the capacitors are arranged at the corners of the overlapping pattern.

According to a third aspect of the present invention, the capacitors are capacitor parts.

According to a fourth aspect of the present invention, each of the capacitor parts is connected in series with a resistor.

BRIEF DESCRIPTION OF THE DRAWINGS

The above object and features as well as other features of the present invention will be more apparent from the following description of the preferred embodiments when read in conjunction with the accompanying drawings, wherein

FIGS. 8 to 13 show results of simulations carried out on the board of FIG. 7;

FIG. 18 shows still another embodiment of the present invention;

DESCRIPTION OF THE PREFERRED EMBODIMENTS

Figure 1A:
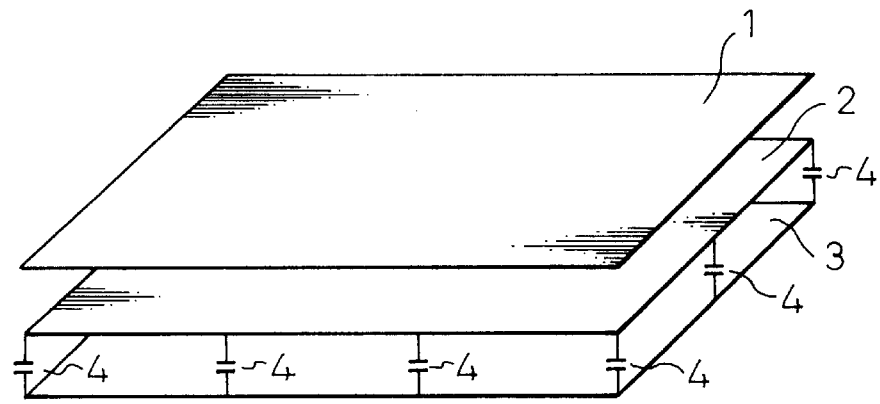
FIGS. 1(a) to 1(c) show the principles of the present invention.
Figure 1B:
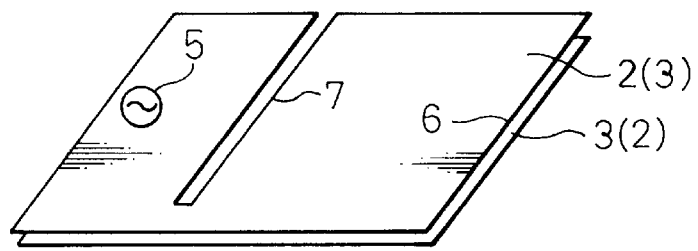
Figure 1C:
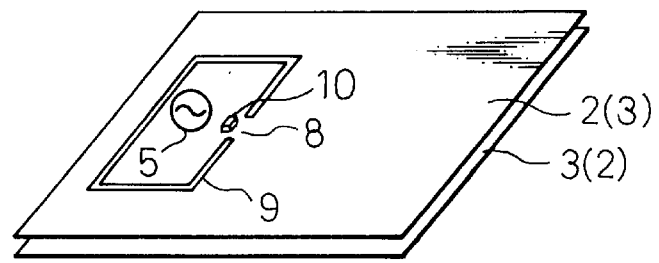

FIGS. 1(a) to 1(c) show principles of multilayer printed boards according to the present invention.

Each multilayer printed board is composed of a signal layer 1 on which electronic circuits are arranged, a power source layer 2 for supplying source power to the electronic circuits, and a ground layer 3 for grounding the electronic circuits.

Insulation material is interposed among the layers 1, 2, and 3, to form the multilayer printed board.

Figure 15A:
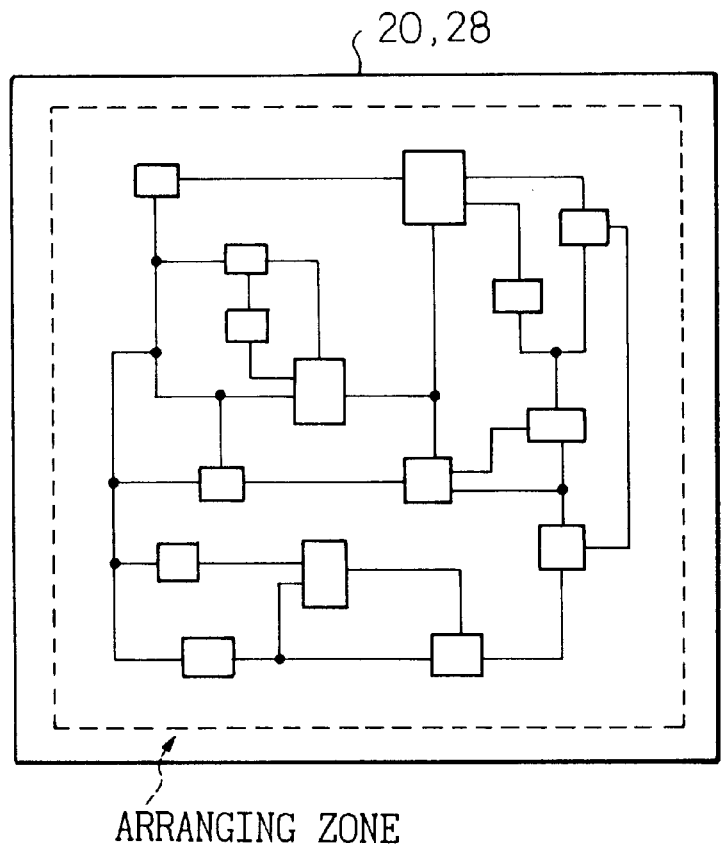
FIGS. 15(a) and 15(b) show another embodiment of the present invention.
Figure 15B:
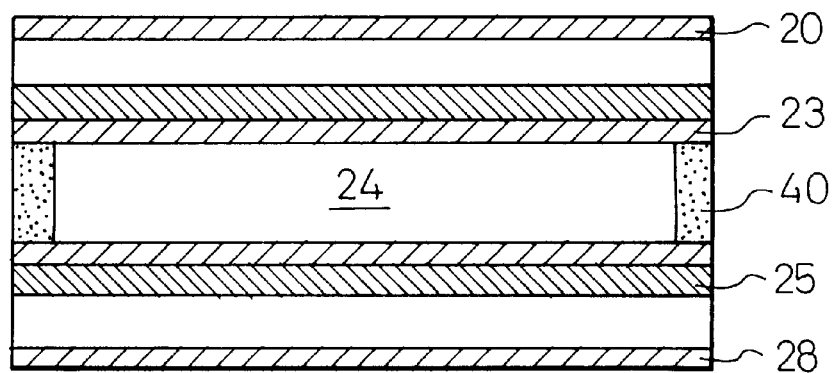

In FIG. 1(a), the multilayer printed board is characterized by capacitors 4 that are continuously (see reference numeral 40 in FIG. 15(b)) or discretely formed at the edges of an overlapping pattern of the power source layer 2 and ground layer 3, to pass a high-frequency current from the layer 2 to the layer 3. If the overlapping pattern has corners, it is preferable to arrange the capacitors 4 at the corners.

The capacitors 4 may be capacitor parts. In this case, each capacitor may be connected in series with a resistor to convert a high-frequency current flowing through the capacitor into heat.

The capacitors 4 may alternatively be formed by arranging second insulation material having a higher relative permittivity than the insulation material arranged between the power source layer 2 and ground layer 3, along the edges of the insulation material between the layers 2 and 3. This realizes higher capacitance.

Figure 16A:
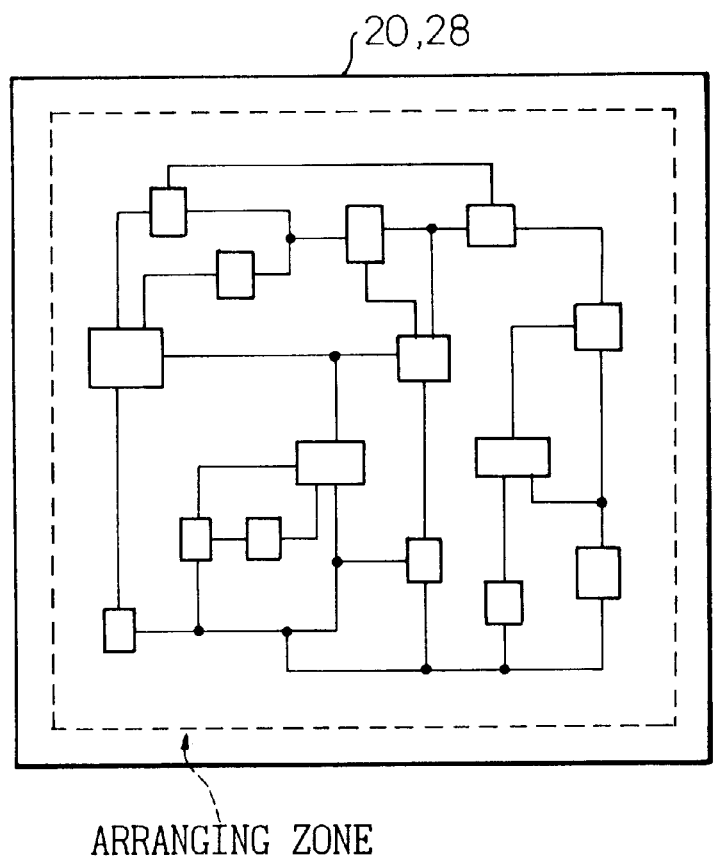
FIGS. 16(a) and 16(b) show still another embodiment of the present invention.
Figure 16B:
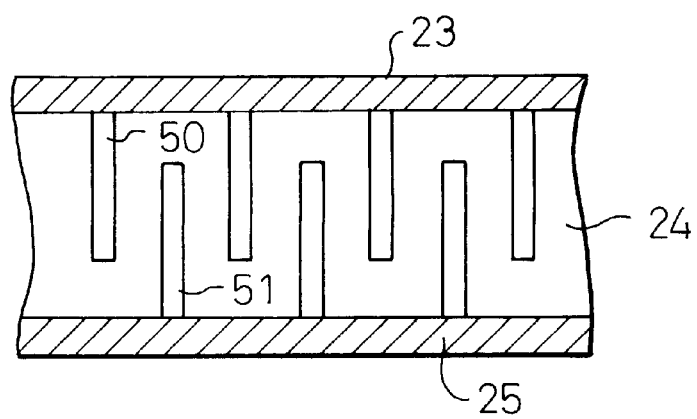

The capacitors 4 may further alternatively be formed with electrodes protruding from the edges of the power source layer 2 toward the ground layer 3 and electrodes protruding from the edges of the ground layer 3 toward the power source layer 2 (see FIG. 16(b)). This structure realizes higher capacitance.

In still another embodiment, the capacitors 4 formed between the power source layer 2 and ground layer 3 may each be connected to an additional capacitor in parallel, to realize higher capacitance.

The additional capacitor may be formed by electrically and partly connecting the edges of the ground layer 3 and signal layer 1 to each other so that the additional capacitor is present between the signal layer 1 and the power source layer 2. Alternatively, the additional capacitor may be formed by electrically and partly connecting the edges of the power source layer 2 and signal layer 1 to each other so that the additional capacitor is present between the signal layer 1 and the ground layer 3. Instead, additional insulation material may be applied to cover the edges of the printed board, and conductive material then applied to cover the additional insulation material. The ground layer 3 is electrically connected to the conductive material, and the power source layer 2 is connected to the additional insulation material, to thereby form the additional capacitor. Instead, the additional capacitor may be formed by electrically connecting the power source layer 2 to the conductive material and by connecting the ground layer 3 to the additional insulation material.

In this way, the principle of FIG. 1(a) of the present invention forms the capacitors 4 continuously or discretely at the edges of an overlapping pattern of the power source layer 2 and ground layer 3 of the multilayer printed board, to pass a high-frequency current from the layer 2 to the layer 3.

The high-frequency current flowing through the power source layer 2 and ground layer 3 is produced by noise including high frequency components that are produced by an electronic circuit mounted on the signal layer 1. If there is no capacitor 4, the high-frequency current becomes zero at the edges of the layers, to produce a strong electric field that emits strong radio waves. The capacitors 4, if arranged, pass the high-frequency current from the power source layer 2 to the ground layer 3, to produce only a weak electric field at the edges, thereby minimizing the emission of radio waves.

The principle of FIG. 1(b) of the present invention is characterized by a cut 7 formed on one or both of the power source layer 2 and ground layer 3 of the multilayer printed board.

A noise source 5 produces a high-frequency current that causes the power source layer 2 to emit radio waves. The radio waves intensify at the resonance frequency of the printed board, which is determined by the distance between the noise source 5 and an edge 6 of the power source layer 2. As the distance becomes shorter, the resonance frequency increases.

Similarly, the noise source 5 produces a high-frequency current that causes the ground layer 3 to emit radio waves. The radio waves intensify at the resonance frequency of the printed board, which is determined by the distance between the noise source 5 and an edge 6 of the ground layer 3. As the distance becomes shorter, the resonance frequency increases.

When the cut 7 is formed on the power source layer 2, the resonance frequency of the printed board increases because the distance between the noise source 5 and the edge 6 of the power source layer 2 is shortened by the cut 7. If the resonance frequency to emit radio waves is sufficiently high, no actual problem will occur.

When the cut 7 is formed on the ground layer 3, the resonance frequency of the printed board increases because the distance between the noise source 5 and the edge 6 of the ground layer 3 is shortened by the cut 7. If the resonance frequency to emit radio waves is sufficiently high, no actual problem will occur.

The principle of FIG. 1(c) of the present invention is characterized by a cut 9 formed on the power source layer 2. The cut 9 surrounds a noise source 5 and has an exit 8 where a capacitor 10 is formed to pass a high-frequency current to the ground layer 3.

Similarly, a cut 9 may alternatively be formed on the ground layer 3. The cut 9 surrounds the noise source 5 and has an exit 8 where a capacitor 10 is formed to pass a high-frequency current to the power source layer 2.

In this way, a high-frequency current produced by the noise source 5 passes through the exit 8 and there the current is passed to the power source layer 2 or the ground layer 3 through the capacitor 10.

This prevents the high-frequency current from flowing to the edges of the power source layer 2 and ground layer 3. As a result, the edges produce only a weak electric field to emit substantially no radio waves that may cause trouble.

Now, the preferred embodiments of the present invention will be explained in detail with reference to the drawings.

Figure 2A:
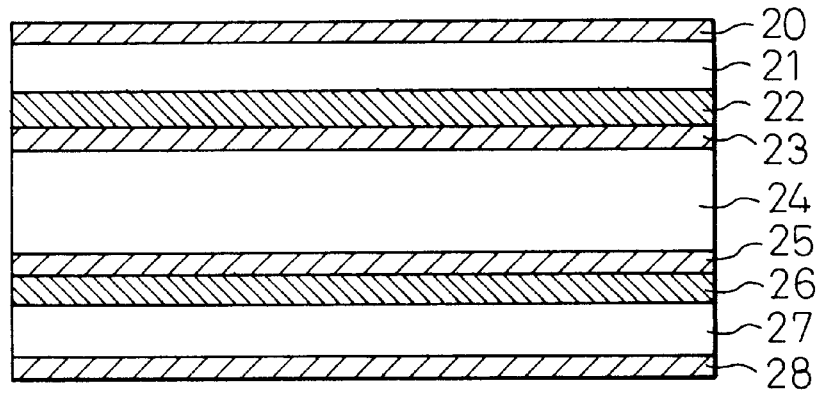
FIGS. 2(a) and 2(b) show a 4-layer printed board to which the present invention is applied.
Figure 2B:
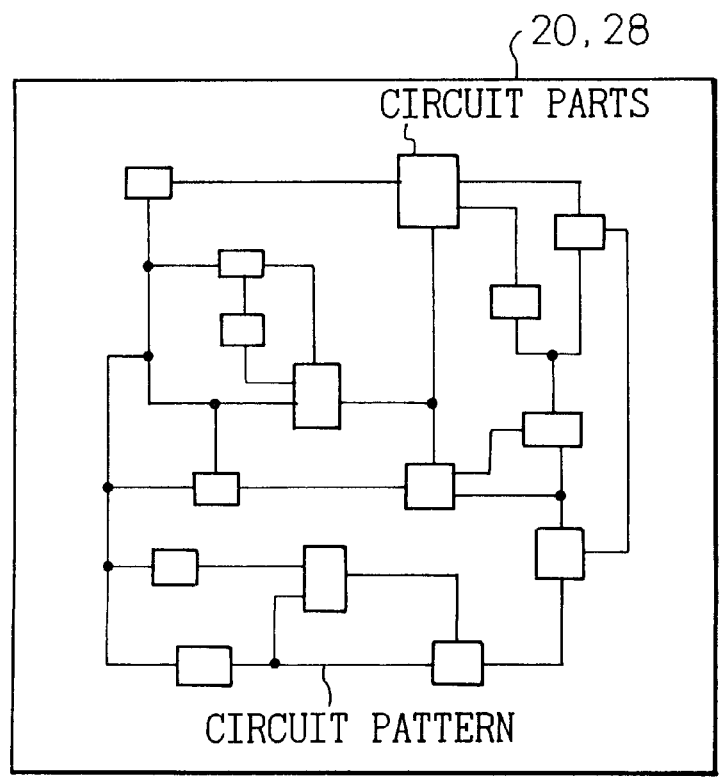

FIGS. 2(a) and 2(b) show a 4-layer printed board to which the present invention is applied.

In FIG. 2(a), the printed board consists of a first signal layer 20, a first core 21, a first prepreg 22, a power source layer 23, a second core 24, a ground layer 25, a second prepreg 26, a third core 27, and a second signal layer 28. The first core 21 and the first prepreg 22 constitute an insulating layer. The second core 24 and the second prepreg 26 constitute another insulating layer.

The first and second signal layers 20 and 28 have circuit patterns of metal such as copper. On the circuit patterns, circuit parts such as chip parts are arranged to provide electronic circuits, as shown in FIG. 2(b). The electronic circuits are electrically connected to the power source layer 23 and ground layer 25 through via holes (herein after referred as vias).

The power source layer 23 is made of metal such as copper, has the same flat shape as the first and second signal layers 20 and 28, and supplies power to the layers 20 and 28 through vias.

The ground layer 25 is made of metal such as copper, has the same shape as the first and second signal layers 20 and 28, and grounds the layers 20 and 28 through vias.

The cores 21, 24, and 27 are made of, for example, glass epoxy resin and serve as the bases of the printed board. The first and third cores 21 and 27 are each, for example, 0.3 mm thick, and the second core 24 is, for example, 0.9 mm thick.

The first and second prepregs 22 and 26 are made of insulation material to provide thickness and a bonding function.

Figure 3:
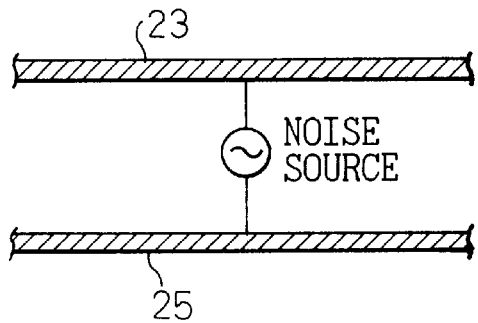
FIG. 3 explains a noise source.
Figure 4:
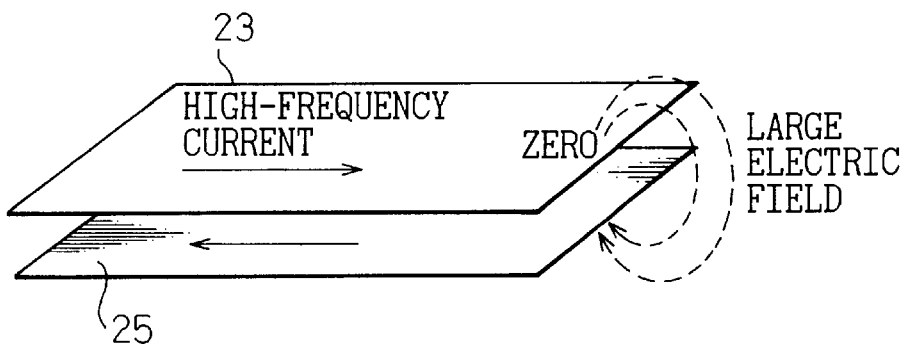
FIG. 4 explains a high-frequency current.

The power source layer 23 provides the first and second signal layers 20 and 28 with source power through the vias. The ground layer 25 grounds the signal layers 20 and 28 through the vias. Depending on the operations of the electronic circuits on the signal layers 20 and 28, a noise source will be present between the power source layer 23 and the ground layer 25, as shown in FIG. 3. The noise source produces a high-frequency current flowing through the power source layer 23 and ground layer 25, as shown in FIG. 4.

The high-frequency current finds no way to go at the edges of the power source layer 23 and ground layer 25, and therefore, becomes zero at the edges to produce a large electric field, which generates radio waves.

Figure 5:
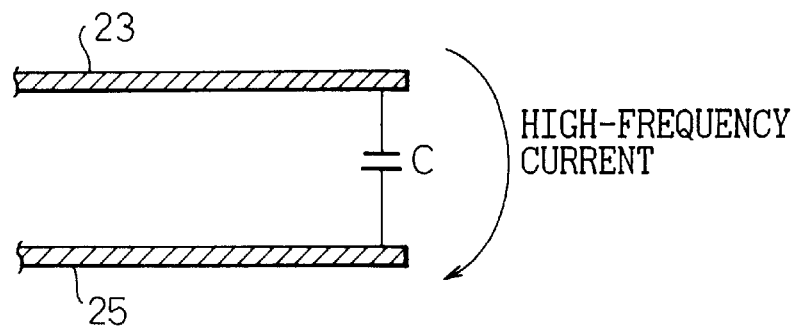
FIG. 5 explains a capacitor according to the present invention.

To reduce the radio waves, the present invention arranges a capacitor between the edges of the power source layer 23 and ground layer 25, as shown in FIG. 5. It is well known that the impedance of a capacitor drops as the frequency of a current applied to the capacitor increases. Namely, the capacitors pass high-frequency currents. The capacitor arranged between the edges of the power source layer 23 and ground layer 25 passes a high-frequency current from the power source layer 23 to the ground layer 25, to greatly reduce radio waves to be emitted from the printed board.

Figure 6A:
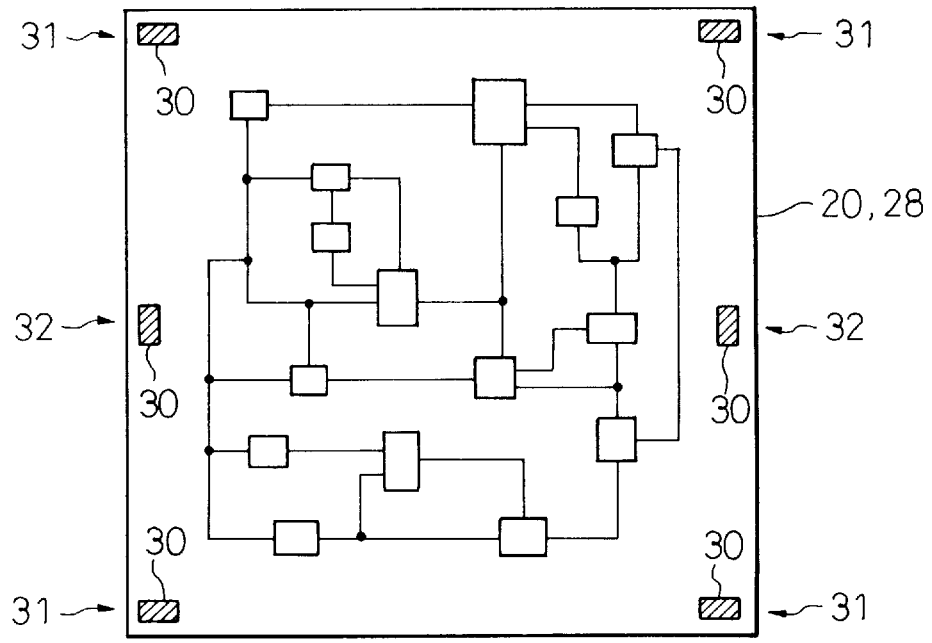
FIGS. 6(a) and 6(b) show a multilayer printed board according to an embodiment of the present invention.
Figure 6B:
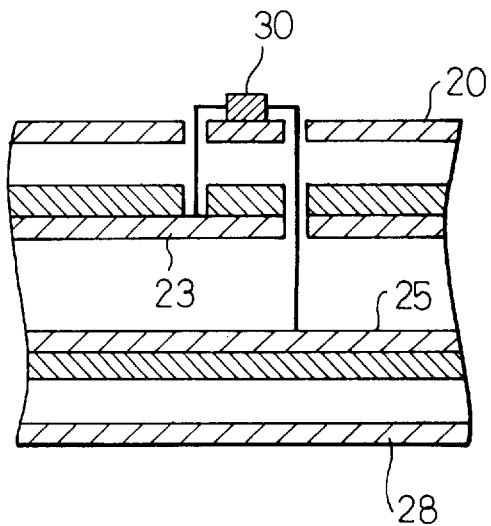

FIGS. 6(a) and 6(b) show an embodiment of the present invention applied to the 4-layer printed board of FIG. 2(a).

In FIG. 6(a), a capacitor 30 is a chip part and has, for example, a capacitance of 1000 pF. Four capacitors 30 are arranged at four corners 31, respectively, on the signal layer 20 (28), and two capacitors 30 are arranged at intermediate locations 32 on the signal layer 20 (28). As shown in FIG. 6(b), one terminal of each capacitor 30 is connected to the power source layer 23 through a via, and the other terminal thereof to the ground layer 25 through a via. The capacitors 30 are positioned at the edges of the power source layer 23 and ground layer 25.

The capacitors 30 pass a high-frequency current from the power source layer 23 to the ground layer 25, to thereby minimize radio waves to be emitted from the printed board.

Each of the capacitors 30 may be connected to a resistor in series between the edges of the power source layer 23 and ground layer 25. The resistor may be a chip part having a resistance of, for example, 10 Ω to convert a high-frequency current passing through the capacitor 30 into heat, thereby minimizing radio waves to be emitted from the printed board.

Simulations to verify the effect of the embodiment will be explained.

The strength of an electromagnetic field produced by an object can be simulated by finding electric and magnetic currents flowing through each part of the object and by substituting them into theoretical electromagnetic wave radiation expressions. Theoretically, electric and magnetic currents flowing through each part of a given object are obtainable by solving a Maxwell's electromagnetic wave equation under given boundary conditions.

A moment method is one of solutions of integration equations derived from the Maxwell's electromagnetic wave equation. The moment method divides a given object into small elements and calculates electric and magnetic currents flowing through each element. The moment method is capable of handling a three-dimensional object having an optional shape. The moment method is described in, for example, "Sinusoidal Reaction Formulation for Radiation and Scattering from Conducting Surface" by H. N. Wang, J. H. Richmond, and M. C. Gilreath, IEEE Transactions Antennas Propagation, Vol. AP-23, 1975.

The moment method forms a mesh of the structure of an electronic device to simulate and chooses a frequency to process. The method calculates the mutual impedance, mutual admittance, and mutual reaction of elements of the mesh. The method substitutes the calculated mutual impedance, etc., and a wave source specified by structural information into simultaneous equations and solves the simultaneous equations, to thereby find the electric and magnetic currents flowing to each element.

The inventors of the present invention have developed simulation programs for processing calculations necessary for the moment method and have filed patent applications related to the simulation programs. The latest patent application filed is Japanese Patent Application No. 9-62591 that simulates the strength of an electromagnetic field in a time domain at high speed.

The inventors have used the simulation programs and verified the effect of the embodiment of FIG. 6.

Figure 7:
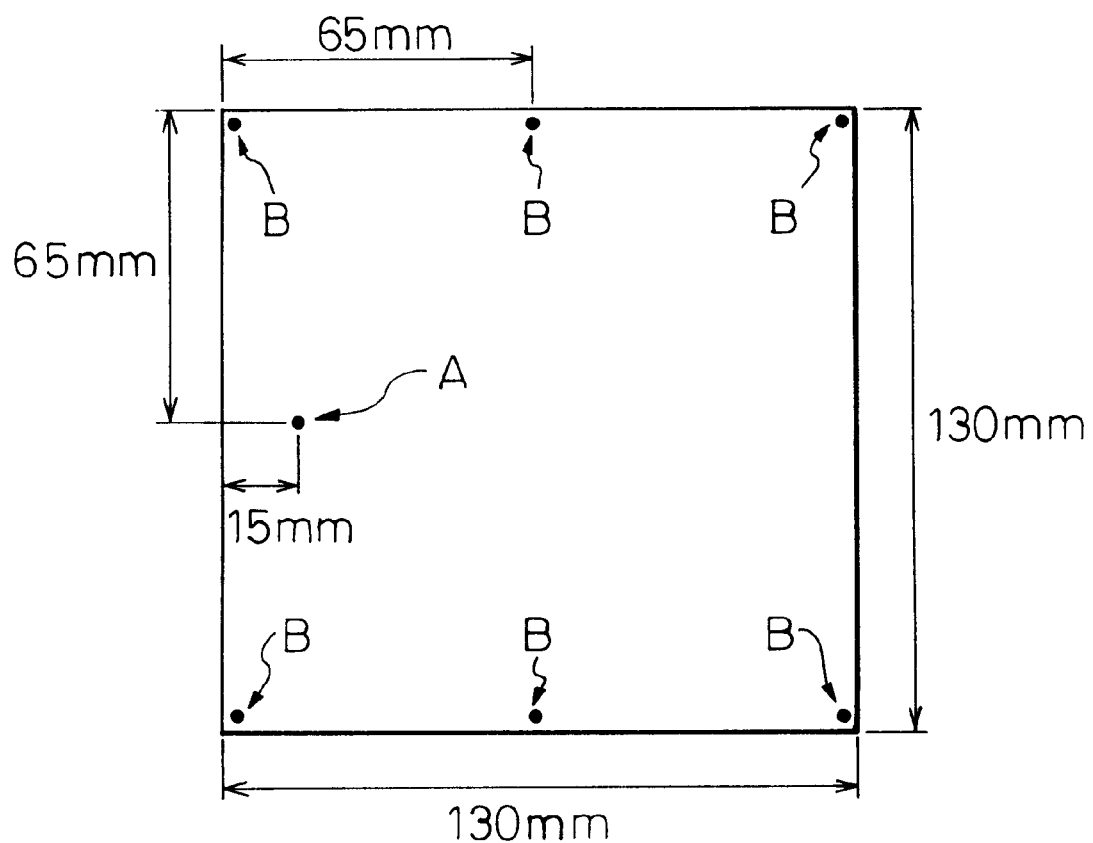
FIG. 7 shows a simulation printed board according to the present invention.

FIG. 7 shows a simulation printed board used for the simulations. The dimensions of the board are 130 mm×130 mm in plan view and 0.9 mm in thickness. The board is made of glass epoxy resin having a relative permittivity $\epsilon_r$ of 4.7 and has a copper film on each of the top and bottom faces thereof. The board has a noise source A that generates a sinusoidal wave of one volt in effective value.

The simulations first find the resonance frequency of the simulation printed board and then a frequency at which the strength of an electric field produced by the board is maximized. Under this frequency, a change in the strength of the electric field produced by the board is observed with and without a 1000 pF capacitor arranged between the top and bottom faces of the board.

FIGS. 8 to 13 show results of the simulations.

Figure 8:
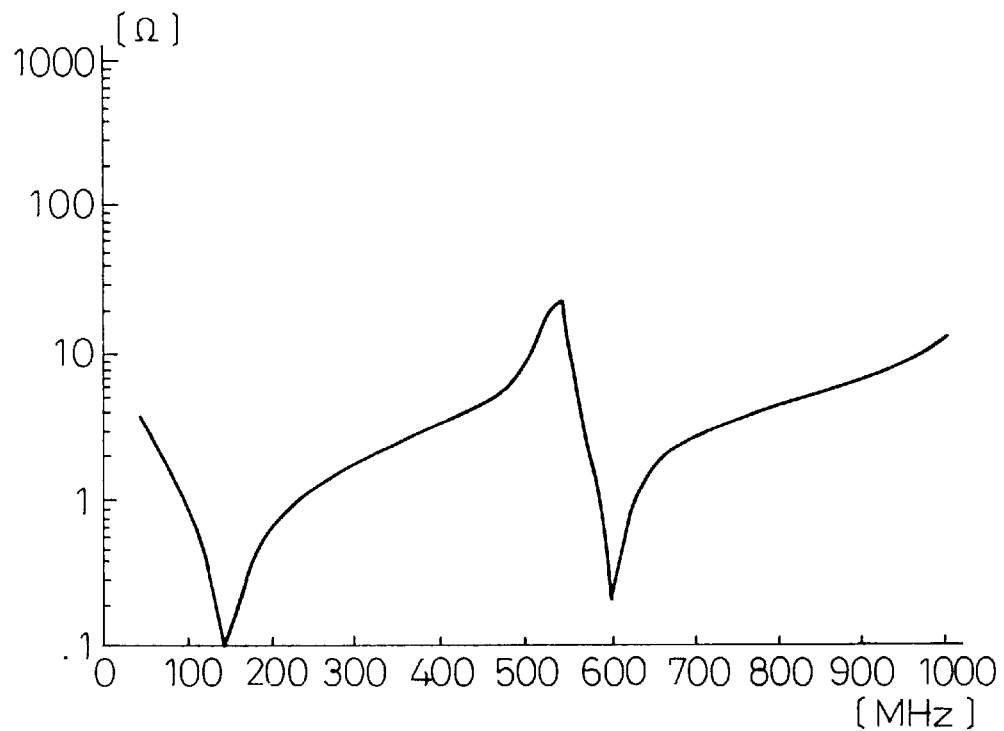

FIG. 8 shows a result of the simulation for finding out the resonance frequency of the simulation printed board.

The simulation was made by changing the frequency of noise produced by the noise source A from 20 MHz to 1000 MHz and by measuring, at each frequency, the impedance of the point A between the top and bottom faces of the board.

It is understood in FIG. 8 that the resonance frequency of the simulation printed board is about 540 MHz.

Figure 9:
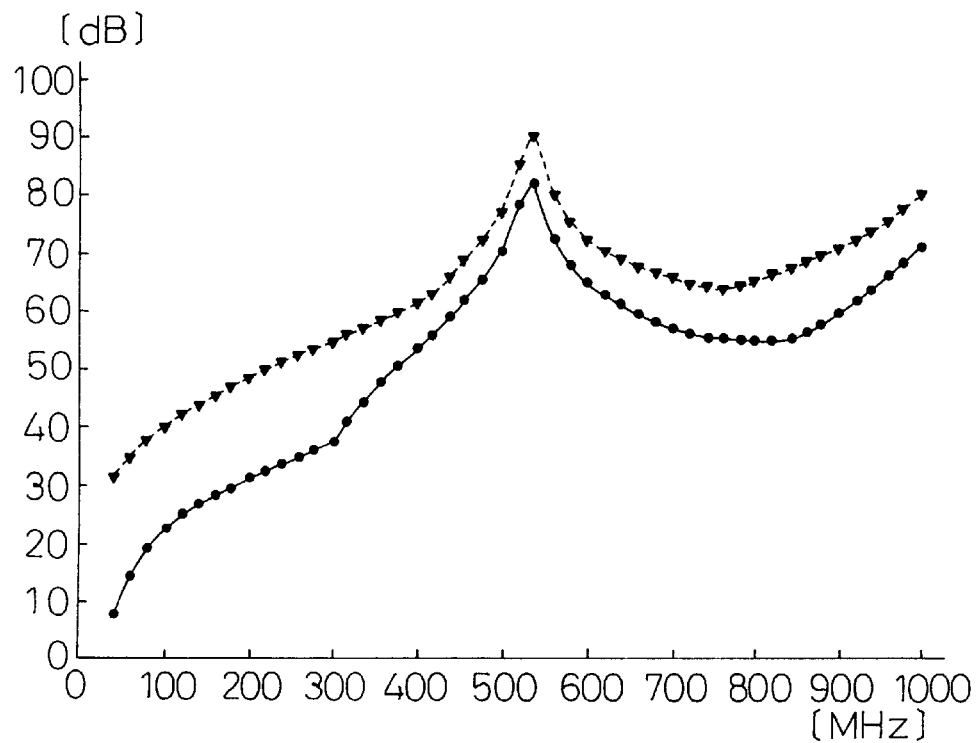

FIG. 9 shows a result of the simulation for finding out the frequency at which the strength of the electric field produced by the simulation printed board is maximized.

The simulation was made by changing the frequency of noise produced by the noise source A from 20 MHz to 1000 MHz and by measuring, at each frequency, the strength of the electric field at an observation point that was three meters away from the board. In FIG. 9, a black circle indicates the strength of the electric field at the observation point in a horizontal polarization direction, and a black triangle indicates the same in a vertical polarization direction.

It is understood in FIG. 9 that the strength of the electric field produced by the board is maximized when the noise frequency agrees with the resonance frequency of 540 MHz.

FIGS. 10 to 13 show results of the simulations to see a difference caused in the strength of the electric field produced by the simulation printed board with and without a 1000 pF capacitor between the top and bottom faces of the board. These simulations were carried out with the noise source A producing 540-MHz noise. Originals of the simulation results are in color, and the simulation results shown in FIGS. 10 to 13 are models of the originals.

Figure 10:
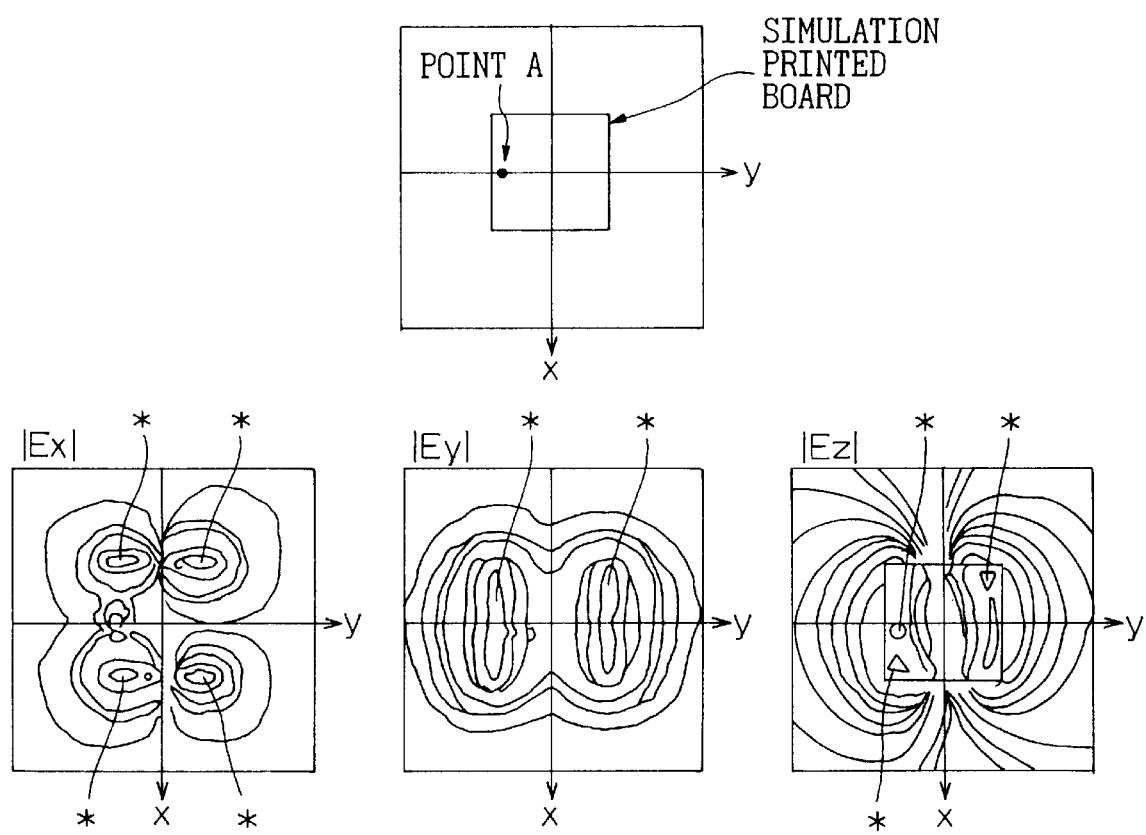

FIG. 10 shows the strengths Ex, Ey, and Ex of the electric field at a position one centimeter above the simulation printed board without the 1000 pF capacitor. FIG. 11 shows the strengths Ex, Ey, and Ez of the electric field at the cross-sectional center of the board under the same conditions.

Figure 12:
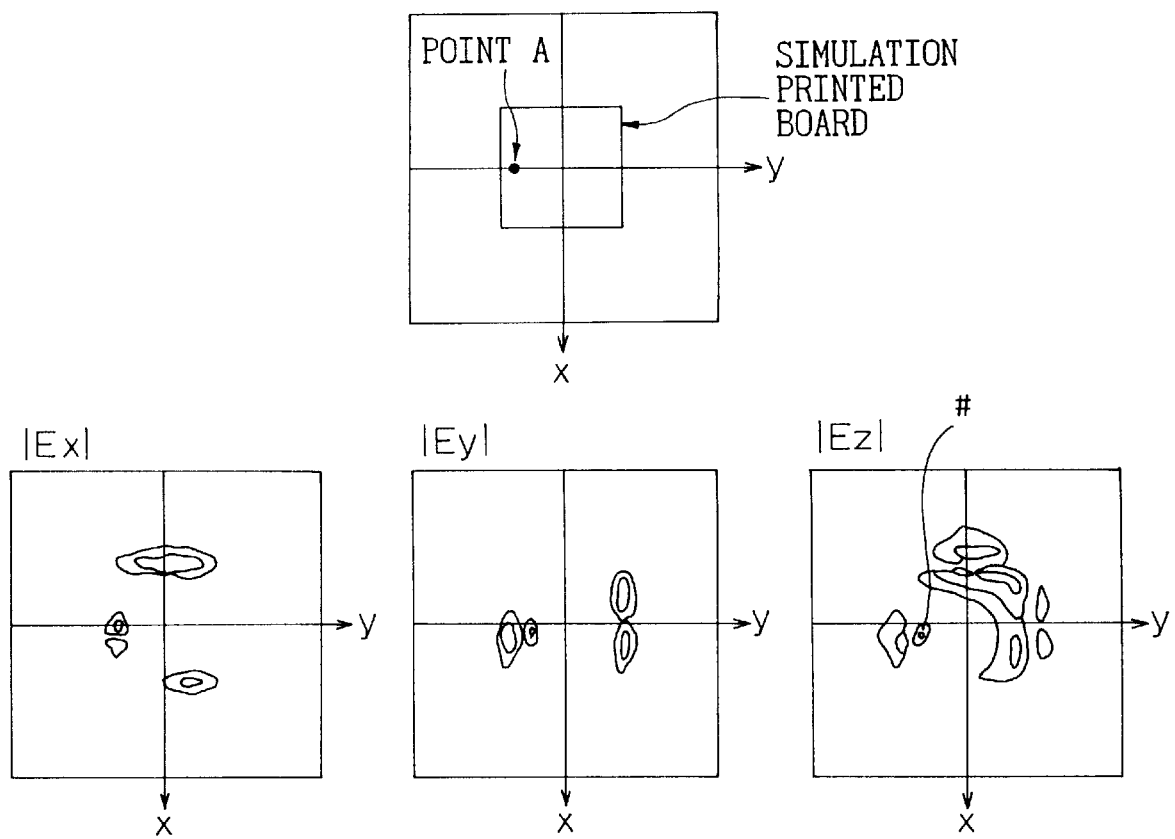

FIG. 12 shows the strengths Ex, Ey, and Ex of the electric field at a position one centimeter above the simulation printed board with the 1000 pF capacitor. FIG. 13 shows the strengths Ex, Ey, and Ez of the electric field at the cross-sectional center of the board under the same conditions.

In FIGS. 10 and 11, a mark "*" indicates an area having an electric field strength of 140 dB ($\mu$V/m). The other areas have lower electric field strengths. It is clear that areas having electric field strengths above 130 dB ($\mu$V/m) are widely spread.

In FIGS. 12 and 13, a mark "#" indicates an area having an electric field strength of 130 dB ($\mu$V/m). The other areas have lower electric field strengths. It is clear that areas having electric field strengths around 110 dB ($\mu$V/m) are small and limited.

It is understood from FIGS. 12 and 13 that the capacitor arranged between the top and bottom faces of the simulation printed board greatly reduces the strength of the electric field produced by the board.

The simulation results verify that the embodiment of FIG. 6 is effective to minimize radio waves to be emitted from a multilayer printed board.

Although the embodiment of FIG. 6 does not specifically show the locations of the capacitors 30, it is preferable to arrange the capacitors 30 at the corners of a given multilayer printed board because the corners usually emit strong radio waves.

Figure 14A:
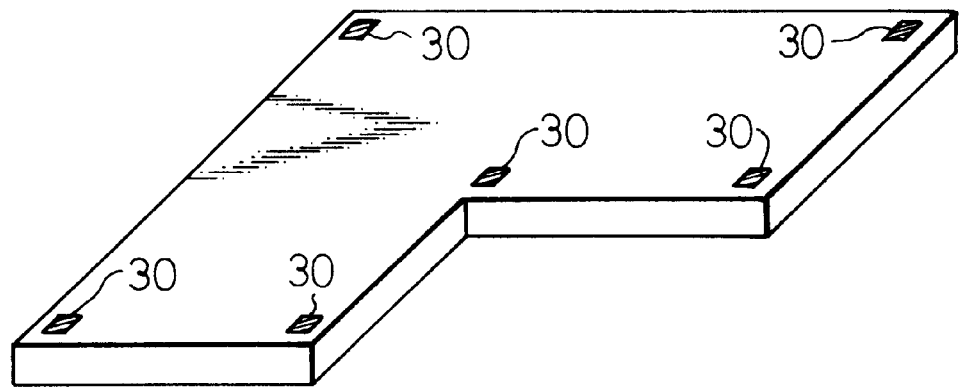
FIGS. 14(a) and 14(b) show the locations of capacitors arranged according to the present invention.

For example, for an L-shaped 4-layer printed board of FIG. 14(a), it is preferable to arrange capacitors 30 at six corners of the board, respectively. It is naturally possible to arrange the capacitors 30 at other locations.

In the embodiment of FIG. 6, the plan shapes of the power source layer 23 and ground layer 25 are identical to those of the first and second signal layers 20 and 28. Namely, the shape of the power source layer 23 agrees with that of the ground layer 25. If the layers 23 and 25 have different shapes, a high-frequency current flows through an overlapping pattern of the layers 23 and 25. Accordingly, the capacitors 30 may be arranged along the edges of the overlapping pattern.

Figure 14B:
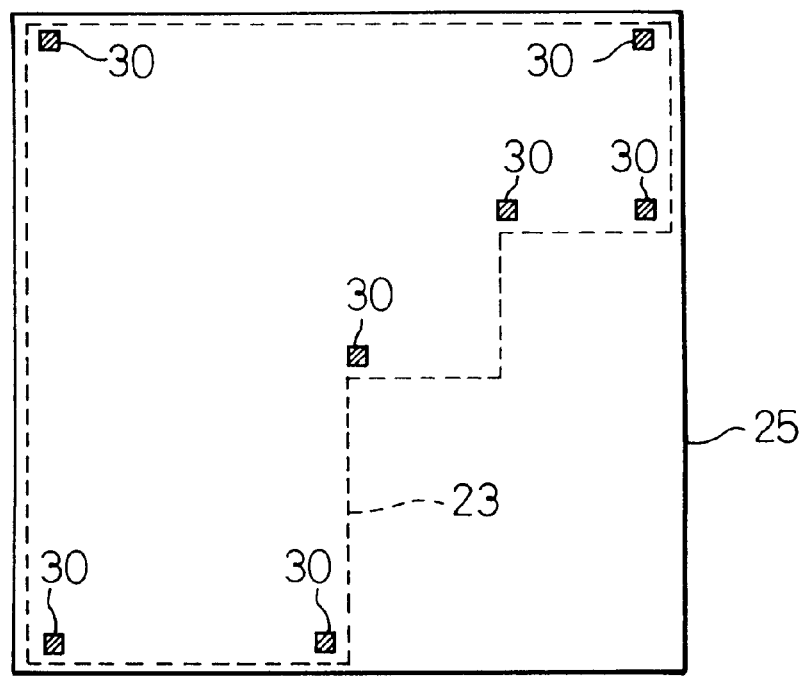

In FIG. 14(b), the shape of the power source layer 23 indicated with a dotted line is included in the shape of the ground layer 25 indicated with a continuous line. In this case, the capacitors 30 are arranged along the edges of an overlapping pattern of the layers 23 and 25, which is identical to the shape of the layer 23. More preferably, the capacitors 30 are arranged at the corners of the overlapping pattern.

Other embodiments of the present invention will be explained.

Each of the following embodiments is basically applied to the 4-layer printed board of FIG. 2(a) with the power source layer 23 and ground layer 25 having the same plan shape as the first and second signal layers 20 and 28. Naturally, the layers may have different shapes. In this case, the following embodiments are applied to an overlapping pattern of the power source layer 23 and ground layer 25.

The embodiment of FIGS. 15(a) and 15(b) will be explained.

In this embodiment, the periphery of the second core 24 is formed with insulation material 40 whose relative permittivity is larger than the relative permittivity of the insulation material that forms the second core 24 itself. The insulation material 40 forms a capacitor that passes a high-frequency current between the edges of the power source layer 23 and ground layer 25.

As is known, the capacitance of a capacitor increases in proportion to the relative permittivity thereof. Accordingly, the insulation material 40 having a larger relative permittivity increases the capacitance between the edges of the power source layer 23 and ground layer 25, to pass a high-frequency current.

The insulation material 40 may be any material if it has a larger relative permittivity than that of the second core 24 itself. If the second core 24 is made of glass epoxy resin having a relative permittivity $\epsilon_r$ of 4.7, the insulation material 40 may be made of silicon carbide having a relative permittivity $\epsilon_r$ of 42, or alumina ceramics having a relative permittivity $\epsilon_r$ of 9.7 to 10.3.

The embodiment of FIGS. 16(a) and 16(b) will be explained.

This embodiment forms electrodes 50 protruding from the power source layer 23 toward the ground layer 25 at the periphery of the second core 24, and electrodes 51 protruding from the ground layer 25 toward the power source layer 23 at the periphery of the second core 24. These electrodes 50 and 51 form capacitors to pass a high-frequency current between the edges of the power source layer 23 and ground layer 25.

As is known, the capacitance of a capacitor increases in reverse proportion to the distance between the electrodes of the capacitor. The capacitors formed with the electrodes 50 and 51 have each a short distance between the electrodes thereof, to increase the capacitance between the edges of the power source layer 23 and ground layer 25, to pass a high-frequency current.

The electrodes 50 and 51 are manufactured according to, for example, a technique of manufacturing vias.

Figure 17A:
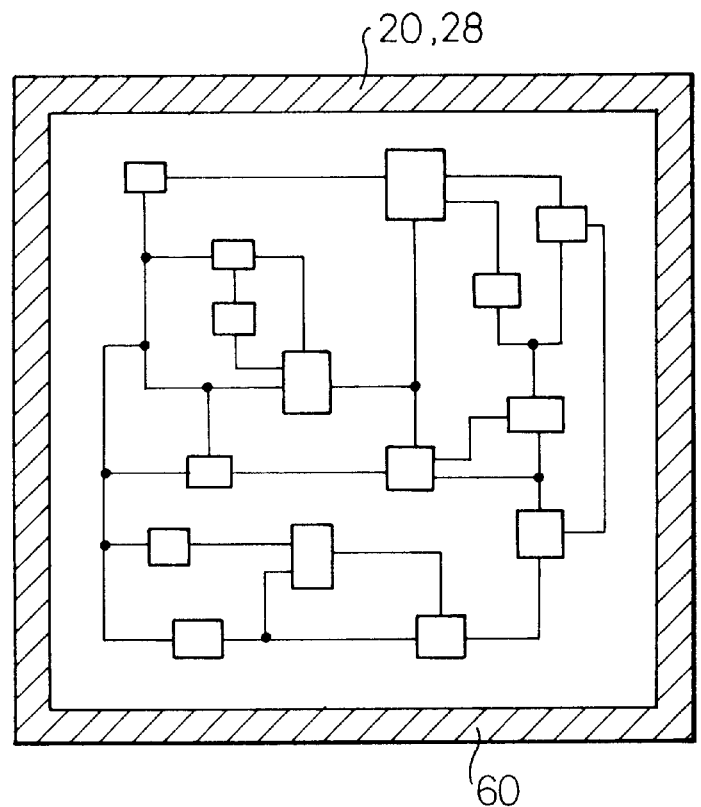
FIGS. 17(a) and 17(b) show still another embodiment of the present invention.
Figure 17B:
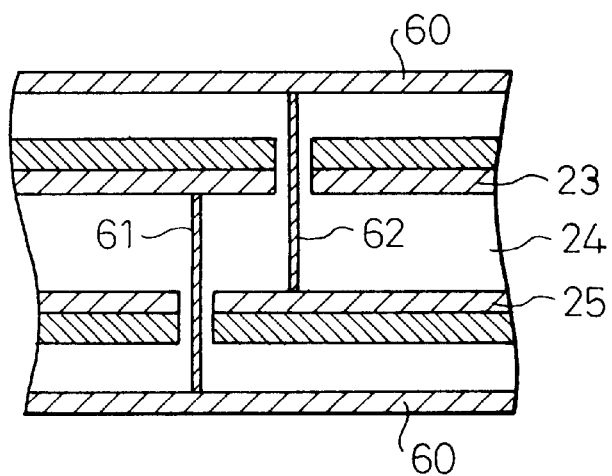

The embodiment of FIGS. 17(a) and 17(b) will be explained.

This embodiment forms a capacitor electrode pattern 60 at the periphery of each of the first and second signal layers 20 and 28. The capacitor electrode pattern 60 is made of a copper film and is different from circuit patterns formed on the signal layers 20 and 28. A first via 61 is formed to connect an edge of the power source layer 23 to the electrode pattern 60 of the second signal layer 28. A second via 62 is formed to connect an edge of the ground layer 25 to the electrode pattern 60 of the first signal layer 20. As a result, capacitors for passing a high-frequency current are formed between the edges of the power source layer 23 and ground layer 25.

FIG. 18 explains the operation of the embodiment of FIG. 17. With the via 61, a capacitor $C_0$ formed between the edges of the power source layer 23 and ground layer 25 is connected in parallel with a capacitor $C_2$ formed between the ground layer 25 and the electrode pattern 60 of the second signal layer 28. With the second via 62, the capacitor $C_0$ is connected in parallel with a capacitor $C_1$ formed between the power source layer 23 and the electrode pattern 60 of the first signal layer 20.

In this way, this embodiment connects the capacitor formed between the edges of the power source layer 23 and ground layer 25 in parallel with other capacitors, thereby increasing capacitance to pass a high-frequency current between the power source layer 23 and the ground layer 25.

The embodiment of FIGS. 19(a) and 19(b) will be explained.

This embodiment covers the edges of the 4-layer printed board with insulation material 70, and the insulation material 70 with conductive material 71 such as conductive paste. In FIG. 19(a), an electrode 72 is formed from an edge of the power source layer 23 through a via and is connected to the insulation material 70. An electrode 73 is formed from an edge of the ground layer 25 through a via and is electrically connected to the conductive material 71.

Figure 19A:
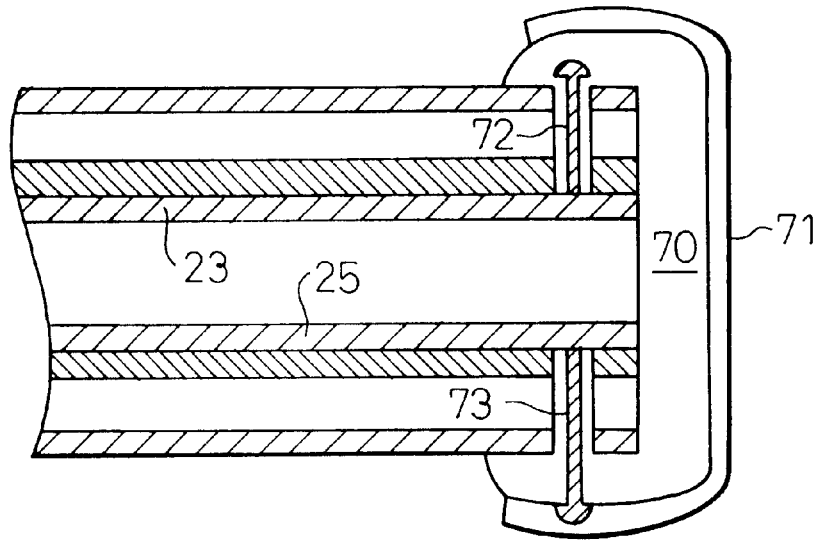
FIGS. 19(a) and 19(b) show still another embodiment of the present invention and a modification thereof.
Figure 19B:
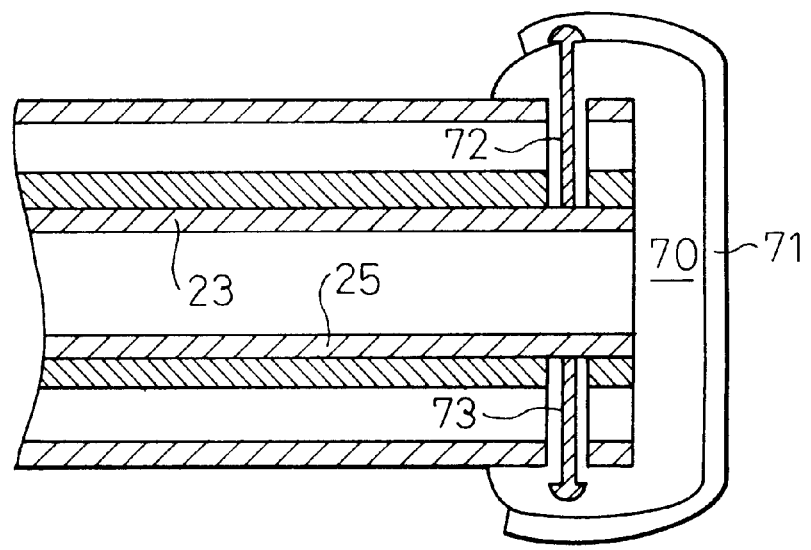

Alternatively, as shown in FIG. 19(b), an electrode 72 is formed from an edge of the power source layer 23 through a via and is electrically connected to the conductive material 71. An electrode 73 is formed from an edge of the ground layer 25 and is connected to the insulation material 70.

According to the embodiment of FIG. 19(a), a capacitor formed between the conductive material 71 and the electrode 72 extending from the power source layer 23 is connected in parallel with a capacitor formed between the edges of the power source layer 23 and ground layer 25. According to the modification of FIG. 19(b), a capacitor formed between the conductive material 71 and the electrode 73 extending from the ground layer 25 is connected in parallel with the capacitor formed between the edges of the power source layer 23 and ground layer 25.

In this way, the capacitor formed between the edges of the power source layer 23 and ground layer 25 is connected in parallel with another capacitor to increase capacitance to pass a high-frequency current between the power source layer 23 and the ground layer 25.

In addition, the conductive material 71 covering the edges of the printed board serves as a shield to further reduce the emission of radio waves.

The embodiment of FIG. 20 will be explained. This embodiment is based on the principle of FIG. 1(b) of the present invention.

This embodiment forms a cut 80 through the power source layer 23 between the position of a noise source on the layer 23 and an edge of the layer 23. Here, the distance between the noise source and the cut 80 is $\beta$, and the distance between the noise source and the edge of the layer 23 is $\alpha$.

In vacuum, a wavelength $\lambda$, a frequency f, and the light speed c have a relationship of $c=\lambda \times f$. Since one megahertz is $10^6$ Hz and the light speed c is $3 \times 10^8$ m/s, the vacuum wavelength $\lambda=300/f$. A relationship between the vacuum wavelength $\lambda$ and a wavelength $\lambda_p$ under a relative permittivity of $\epsilon_r$ is expressed as $\lambda_p=\lambda/(\epsilon_r)^{1/2}$.

Figure 21:
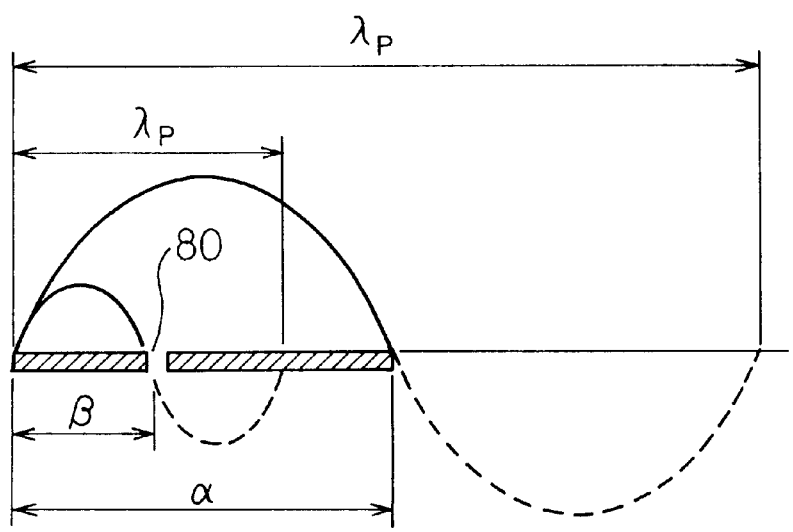
FIG. 21 explains the resonance frequency of a printed board.

If there is no cut 80, a high-frequency current produces radio waves, which resonate if $\lambda_p=2\alpha$ as shown in FIG. 21, where $\lambda_p$ is the wavelength of the radio waves. Accordingly, the resonance frequency f is calculated as follows:

$$2\alpha=\lambda_p=\lambda/(\epsilon_r)^{1/2}=300/[f\times(\epsilon_r)^{1/2}]$$

$$f=[150/(\epsilon_r)^{1/2}]\times[1/\alpha]$$

If there is the cut 80, the radio waves resonate if $\lambda_p=2\beta$ as shown in FIG. 21. Accordingly, the resonance frequency f is calculated as follows:

$$2\beta=\lambda_p=\lambda/(\epsilon_r)^{1/2}=300/[f\times(\epsilon_r)^{1/2}]$$

$$f=[150/(\epsilon_r)^{1/2}]\times[1/\beta]$$

In this way, the cut 80 increases the resonance frequency. As explained with reference to the simulation result of FIG. 9, the emission of radio waves is maximized at the resonance frequency.

Regulations to restrict radio wave emission usually concern about radio waves having frequencies of 1000 MHz or below, and there are no actual problems or restrictions on radio waves of higher frequencies. Accordingly, if the cut 80 is formed to provide a resonance frequency of greater than 1000 MHz, no radio waves that raise problems will be emitted.

Figure 20:
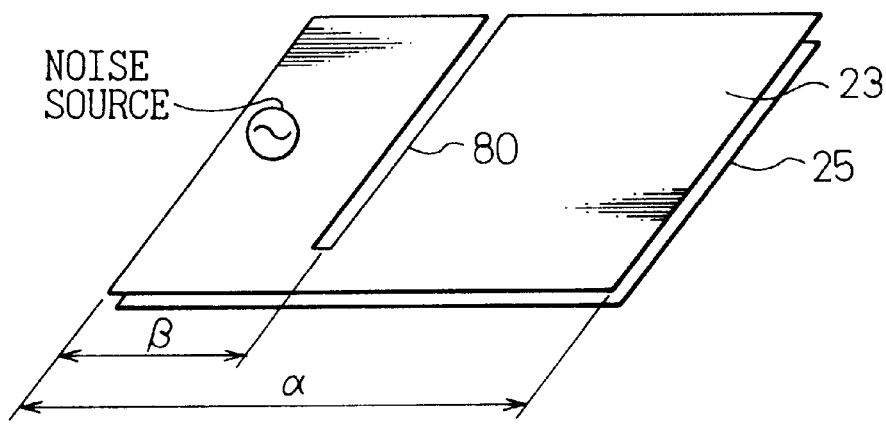
FIG. 20 shows still another embodiment of the present invention.

The embodiment of FIG. 20 forms the cut 80 on the power source layer 23 in a way to avoid the radio wave emission problems.

If the second core 24 of the board of FIG. 20 is made of glass epoxy resin having a relative permittivity $\epsilon_r$ of 4.7, the distance $\beta$ for realizing a resonance frequency of greater than 1000 MHz must be as follows or shorter:

$$\beta=[150/(4.7)^{1/2}]\times[1/1000]=0.069[m]$$

Although the embodiment of FIG. 20 forms the cut 80 on the power source layer 23, it may be formed on the ground layer 25.

The embodiment of FIGS. 22(a) and 22(b) will be explained. This embodiment is based on the principle of FIG. 1(c) of the present invention.

This embodiment forms a cut 91 through the power source layer 23, to surround a noise source. The cut 91 has an exit 90 at which the embodiment forms a capacitor 92 to pass a high-frequency current to the ground layer 25.

The capacitor 92 may be a chip part. As shown in FIG. 22(b), one terminal of the capacitor 92 is connected to the power source layer 23 through a via, and the other terminal thereof to the ground layer 25 through a via.

A high-frequency current produced by the noise source tries to pass the exit 90 where the capacitor 92 makes the current flow to the ground layer 25. As a result, the current does not reach the edges of the power source layer 23, and therefore, the edges of the power source layer 23 produce only a weak electric field that emits very weak radio waves.

Figure 22A:
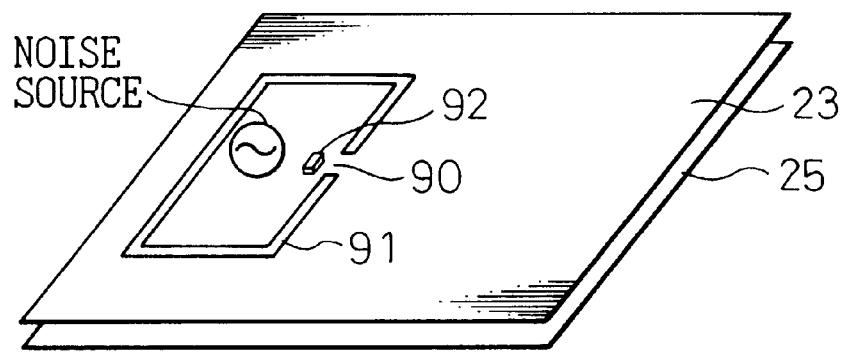
FIGS. 22(a) and 22(b) show still another embodiment of the present invention.
Figure 22B:
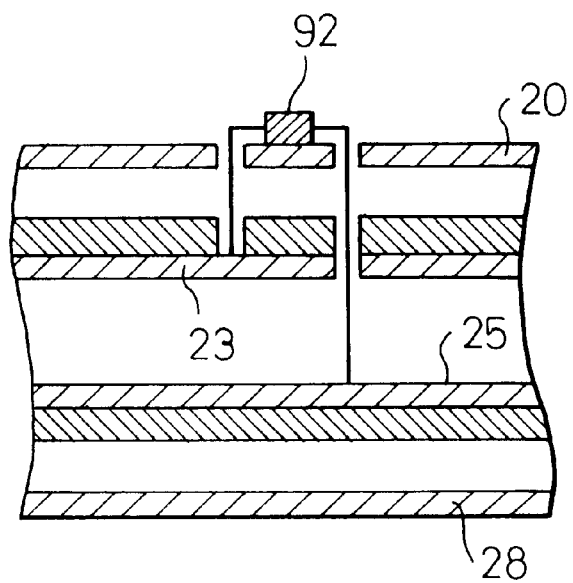

Although the cut 91 is formed on the power source layer 23 in FIG. 22(a), it may be formed on the ground layer 25 with the exit 90 of the cut 91 being provided with a capacitor 92 for passing a high-frequency current to the power source layer 23. The capacitor 92 is not limited to a chip part. If the capacitor 92 is a chip part, it may be connected in series with resistor, to convert a high-frequency current passing through the capacitor 92 into heat.

As explained above, the present invention provides a multilayer printed board capable of greatly reducing the emission of unwanted radio waves.

Consequently, an electronic apparatus employing the multilayer printed board of the present invention emits substantially no unwanted radio waves.

What is claimed is:

1. A multilayer printed board, comprising:
   a signal layer, a power source layer, and a ground layer formed one upon another with first insulation material, having a first relative permittivity, interposed therebetween;
   capacitor means, formed continuously or discretely along a periphery of an overlapping pattern of the power source layer and the ground layer for passing a high-frequency current from the power source layer to the ground layer and comprising a second insulation material having a second relative permittivity, larger than the first relative permittivity arranged between the power source layer and the ground layer along the periphery of the overlapping pattern.

2. The multilayer printed board of claim 1, wherein each capacitor comprises capacitor parts.

3. The multilayer printed board of claim 2, wherein each of the capacitor parts is connected in series with a respective resistor.

4. The multilayer printed board of claim 1, wherein the capacitor means comprises discrete capacitors, arranged at respective corners of the periphery of the overlapping pattern.

5. The multilayer printed board of claim 1, wherein the capacitor means comprises discrete capacitors arranged at respective corners of the overlapping pattern.

6. A multilayer printed board, comprising:

a signal layer, a power source layer, and a ground layer formed one upon another with first insulation material, having a first relative permittivity, interposed therebetween;

capacitor means, formed continuously or discretely along a periphery of an overlapping pattern of the power source layer and the ground layer for passing a high-frequency current from the power source layer to the ground layer and comprising:

first electrodes protruding from the power source layer toward the ground layer along the periphery of the overlapping pattern; and second electrodes protruding from the ground layer toward the power source layer along the periphery of the overlapping pattern, each pair of adjacent first and second electrodes defining a corresponding capacitor.

7. A multilayer printed board, comprising:

a signal layer, a power source layer, and a ground layer formed one upon another with first insulation material, having a first relative permittivity, interposed therebetween:

capacitor means, formed continuously or discretely along a periphery of an overlapping pattern of the power source layer and the ground layer, for passing a high-frequency current from the power source layer to the ground layer; and additional capacitor means, formed along the periphery of the overlapping pattern and connected in parallel with the first capacitor means, for passing a high-frequency current from the power source layer to the ground layer, the power source layer being electrically connected to the signal layer at the periphery of the overlapping pattern to form the additional capacitor means.

8. A multilayer printed board, comprising:

a signal layers a power source layer, and a ground layer formed one upon another with first insulation material, having a first relative permittivity, interposed therebetween, capacitor means, formed continuously or discretely along a periphery of an overlapping pattern of the power source layer and the ground layer for passing a high-frequency current from the power source layer to the ground layer; and additional capacitor means, formed alone the periphery of the overlapping pattern and connected in parallel with the first capacitor means, for passing a high-frequency current from the power source layer to the ground layer, the ground layer being electrically connected to the signal layer at the periphery of the overlapping pattern, to form the additional capacitor means.

9. A multilayer printed board, comprising:

a signal layer, a power source layer, and a ground layer formed one upon another with first insulation material, having a first relative permittivity, interposed therebetween;

capacitor means, formed continuously or discretely along a periphery of an overlapping pattern of the power source layer and the ground layer for passing a high-frequency current from the power source layer to the ground layer; and additional capacitor means, formed along the periphery of the overlapping pattern and connected in parallel with the first capacitor means, for passing a high-frequency current from the power source layer to the ground layer, and comprising additional insulation material formed on an end of the printed board along the periphery of the overlapping pattern and covered with conductive material, one of the ground layer and the power source layer being electrically connected to the conductive material and the other thereof being connected to the additional insulation material.

10. A multilayer printed board, comprising:

a signal layer, a power source layer, and a ground layer formed one upon another with a first insulation material, having a first relative permittivity, interposed therebetween, the power source layer and the ground layer having an overlapping pattern defined by a periphery; and a second insulation material having a second relative permittivity, larger than the first relative permittivity, arranged between the power source layer and the ground layer along the periphery of the overlapping pattern thereof and forming a continuous capacitor extending along, or plural discrete capacitors at spaced positions along, the periphery of the overlapping pattern and passing high-frequency current from the power source layer to the ground layer.

11. The multilayer printed board as recited in claim 10, wherein:

the second insulation material forms discrete capacitors positioned at respective corner portions of the periphery of the overlapping pattern.

12. The multilayer printed board as recited in claim 10, further comprising an additional continuous capacitor, or additional discrete capacitors, formed at the edges of the printed board along the periphery of the overlapping pattern and connected in parallel with the continuous capacitor or plural discrete capacitors, respectively, between the power source layer and the ground layer and passing a high-frequency current from the power source layer to the ground layer.

13. The multilayer printed board as recited in claim 12, wherein the power source layer is electrically connected to the signal layer at the periphery of the overlapping pattern, to form the additional continuous capacitor or additional discrete capacitors.

14. The multilayer printed board as recited in claim 12, wherein the ground layer is electrically connected to the signal layer at the periphery of the overlapping pattern, to form the additional continuous capacitors or discrete capacitors.

15. The multilayer printed board of claim 12, further comprising additional insulation material formed on the end of the printed board along the periphery of the overlapping pattern and covered with conductive material, one of the ground layer and the power source layer being electrically connected to the conductive material and the other thereof being connected to the additional insulation material, to form the additional continuous capacitor or additional discrete capacitors.

16. The multilayer printed board of claim 15, wherein the discrete capacitors are arranged at respective corners of the overlapping pattern.

* * * * *

UNITED STATES PATENT AND TRADEMARK OFFICE
CERTIFICATE OF CORRECTION

PATENT NO.:     5,926,377
DATED     :     July 20, 1999
INVENTOR(S):    Tomoyuki NAKAO et al.

It is certified that error appears in the above-identified patent and that said Letters Patent is hereby corrected as shown below:

Col. 11,   line 41, change "layers" to --layer,--.

Signed and Sealed this

Seventh Day of December, 1999

Attest:

Q. TODD DICKINSON

*Attesting Officer*     Acting Commissioner of Patents and Trademarks